US009175392B2

(12) United States Patent
Satitpunwaycha et al.

(10) Patent No.: US 9,175,392 B2
(45) Date of Patent: Nov. 3, 2015

(54) SYSTEM FOR MULTI-REGION PROCESSING

(75) Inventors: Peter Satitpunwaycha, Sunnyvale, CA (US); Kent Child, Dublin, CA (US)

(73) Assignee: Intermolecular, Inc., San Jose, CA (US)

( * ) Notice: Subject to any disclaimer, the term of this patent is extended or adjusted under 35 U.S.C. 154(b) by 581 days.

(21) Appl. No.: 13/162,707

(22) Filed: Jun. 17, 2011

(65) Prior Publication Data

US 2012/0321786 A1 Dec. 20, 2012

(51) Int. Cl.
*C23C 16/455* (2006.01)
*C23C 16/44* (2006.01)
*C23C 16/46* (2006.01)
*C23C 16/52* (2006.01)

(52) U.S. Cl.
CPC ....... *C23C 16/45565* (2013.01); *C23C 16/4401* (2013.01); *C23C 16/4408* (2013.01); *C23C 16/45519* (2013.01); *C23C 16/52* (2013.01); *C23C 16/46* (2013.01)

(58) Field of Classification Search
CPC ............. C23C 16/45565; C23C 16/52; C23C 16/4401; C23C 16/4408; C23C 16/45519; C23C 16/46
See application file for complete search history.

(56) References Cited

U.S. PATENT DOCUMENTS

| | | | | | |
|---|---|---|---|---|---|
| 5,122,391 | A | * | 6/1992 | Mayer | 427/126.3 |
| 5,413,671 | A | * | 5/1995 | Ketchum | 216/37 |
| 5,688,359 | A | * | 11/1997 | Martin | 156/345.19 |
| 5,901,716 | A | * | 5/1999 | Hwang et al. | 134/25.4 |
| 8,900,364 | B2 | * | 12/2014 | Wright | C23C 16/45565 118/715 |
| 2001/0007244 | A1 | * | 7/2001 | Matsuse | 118/719 |
| 2004/0052972 | A1 | * | 3/2004 | Schmitt | 427/569 |
| 2005/0268856 | A1 | * | 12/2005 | Miller et al. | 118/729 |
| 2007/0095286 | A1 | * | 5/2007 | Baek et al. | 118/719 |
| 2007/0215036 | A1 | * | 9/2007 | Park et al. | 117/88 |
| 2009/0047881 | A1 | * | 2/2009 | Satitpunwaycha et al. | 451/291 |
| 2009/0061083 | A1 | * | 3/2009 | Chiang et al. | 427/248.1 |
| 2009/0061646 | A1 | * | 3/2009 | Chiang | C23C 16/45544 438/763 |
| 2009/0165715 | A1 | * | 7/2009 | Oh | C23C 16/45551 118/723 R |
| 2009/0214798 | A1 | * | 8/2009 | Yousif | H01L 21/6708 427/534 |
| 2010/0059182 | A1 | * | 3/2010 | Lee et al. | 156/345.52 |
| 2010/0221426 | A1 | * | 9/2010 | Sferlazzo | C23C 16/45551 427/255.26 |
| 2010/0300482 | A1 | * | 12/2010 | Miura | 134/1.1 |
| 2012/0225207 | A1 | * | 9/2012 | Yudovsky | C23C 16/45551 427/255.5 |
| 2013/0130490 | A1 | * | 5/2013 | Lee | C23C 16/04 438/597 |
| 2013/0171832 | A1 | * | 7/2013 | French | C23C 16/04 438/758 |
| 2013/0316472 | A1 | * | 11/2013 | Joshi | G01N 27/002 438/17 |
| 2014/0008763 | A1 | * | 1/2014 | Mujumdar | H01L 22/34 257/535 |
| 2014/0110764 | A1 | * | 4/2014 | Niyogi | C23C 14/04 257/288 |
| 2014/0127422 | A1 | * | 5/2014 | Shao | C23C 16/04 427/535 |
| 2014/0141534 | A1 | * | 5/2014 | Phatak | B01J 19/0046 438/5 |
| 2014/0154859 | A1 | * | 6/2014 | Gopal | H01L 22/34 438/382 |
| 2014/0162384 | A1 | * | 6/2014 | Joshi | H01L 22/14 438/17 |
| 2014/0179033 | A1 | * | 6/2014 | Mathur | H01L 22/14 438/17 |
| 2014/0264871 | A1 | * | 9/2014 | Lee | H01L 23/53238 257/751 |
| 2015/0140696 | A1 | * | 5/2015 | Ahmed | H01L 21/22 438/17 |

* cited by examiner

*Primary Examiner* — Jeffrie R Lund

(57) ABSTRACT

A gas distribution structure for supplying reactant gases and purge gases to independent process cells to deposit thin films on separate regions of a substrate is described. Each process cell has an associated ring purge and exhaust manifold to prevent reactive gases from forming deposits on the surface of the wafer between the isolated regions. Each process cell has an associated showerhead for conveying the reactive gases to the substrate. The showerheads can be independently rotated to simulate the rotation parameter for the deposition process.

20 Claims, 6 Drawing Sheets

SYSTEM FOR MULTI-REGION PROCESSING

FIELD OF THE INVENTION

The present invention relates generally to systems for high productivity combinatorial materials screening using chemical vapor deposition processes. A specific example will include systems for high productivity combinatorial materials screening using metal organic chemical vapor deposition processes.

BACKGROUND OF THE INVENTION

The manufacture of integrated circuits (IC), semiconductor devices, flat panel displays, optoelectronics devices, data storage devices, magneto-electronic devices, magneto-optic devices, packaged devices, and the like entails the integration and sequencing of many unit processing steps. As an example, IC manufacturing typically includes a series of processing steps such as cleaning, surface preparation, deposition, lithography, patterning, etching, planarization, implantation, thermal annealing, and other related unit processing steps. The precise sequencing and integration of the unit processing steps enables the formation of functional devices meeting desired performance metrics such as speed, power consumption, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). However, the HPC systems used for development of PVD, ALD, and CVD processes have not implemented a variable for rotation within each site isolated region.

One class of deposition methods that has not been successfully adapted to HPC processing techniques involves the use of metal organic chemical vapor deposition (MOCVD) technologies for the deposition of thin films. Issues arise in the adaptation of HPC techniques to MOCVD technologies due to the high temperatures and corrosive gases that are typical of MOCVD processes. Additionally, rotation is often an important variable in the development of MOCVD processes.

MOCVD processes are used for the deposition of a number of important materials and devices. MOCVD is used in the formation of III-V materials such as GaAs, GaAlAs, InP, GaP, GaN, etc. MOCVD is also used in the formation of II-VI materials such as CdTe, CdS, ZnSe, ZnS, etc. These materials are used in devices such as compound semiconductor ICs, solar cells, light emitting diodes (LED), solid state lasers, etc. These materials are expensive and the development times can be long.

Therefore, there is a need to develop systems that allow HPC processing techniques to include a rotation variable within each site isolated region. There is an additional need to develop systems that allow HPC processing techniques to be adapted to MOCVD deposition processes to improve the efficiency of development activities and lower the costs of development activities. There is also a need to develop systems that can be scaled to a variety of substrate sizes ranging from small semiconductor substrates to large solar panels.

SUMMARY OF THE INVENTION

In some embodiments of the present invention, independent process cells comprise individual showerheads that supply reactants to separate regions of a substrate. The showerheads have the additional advantage in that they have an option to be rotated to include the rotation parameter that may be important in single substrate processing systems. Each process cell is independent of the others and an interstitial purge serves to prevent cross-contamination between adjacent independent process cells. Each process cell may have different characteristics from the others. In some embodiments, the process cells have a circular shape, a triangular shape, a square shape, a rectangular shape, a hexagonal shape, or an octagonal shape.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1:
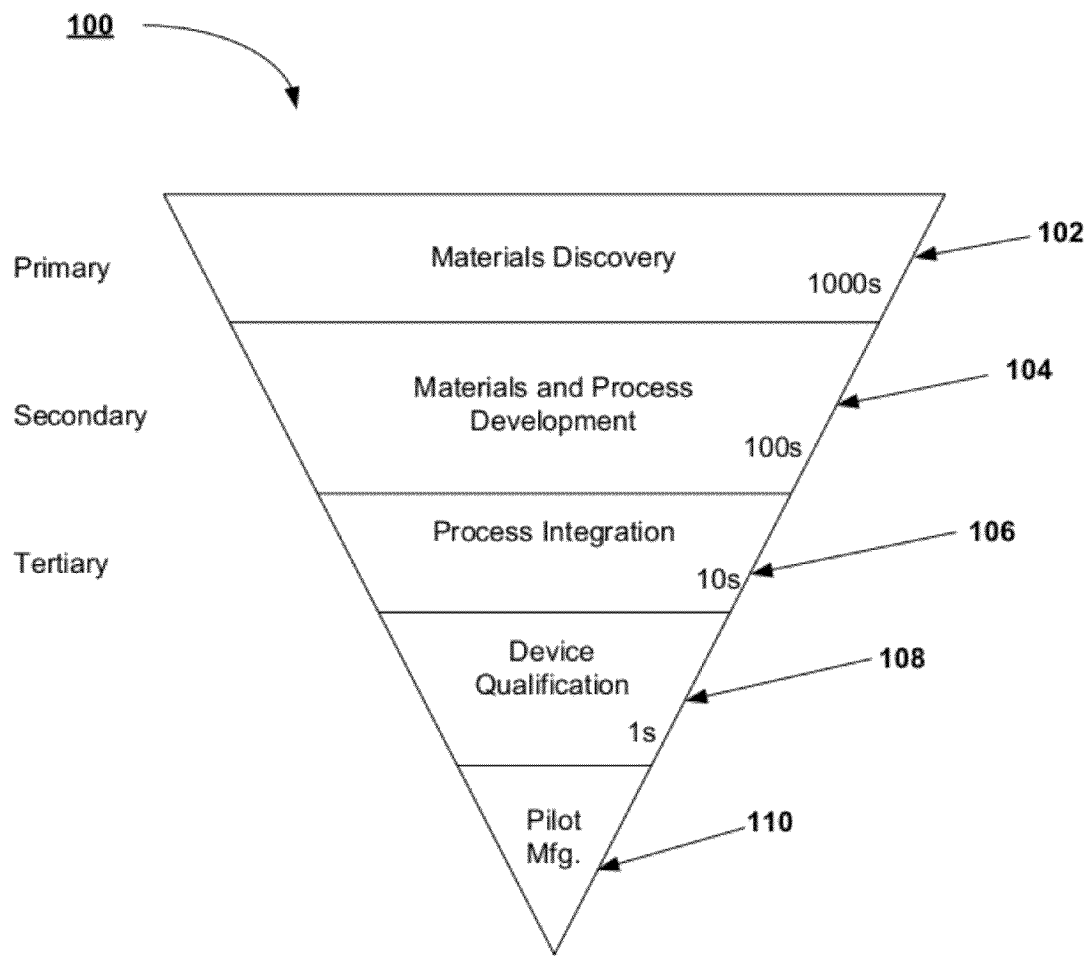
FIG. 1 is a schematic diagram for implementing combinatorial processing and evaluation.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing wafers into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full wafers within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

Typically, MOCVD depositions are performed at high temperatures. For example, the growth of GaN by MOCVD methods is generally performed at temperatures in excess of 1000 C. At these temperatures, the precursor gases exhibit high reactivity and must be separated until they reach the substrate surface to prevent unwanted deposition on the gas distribution system and the walls of the deposition system. The deposition system is usually constructed from stainless steel or quartz. The walls of the deposition system are cooled by the use of water channels. The substrates are held on graphite or SiC susceptors that are heated by induction. The precursor gases are generally introduced through water cooled showerhead assemblies or through multiple injection ports. High throughput, industrial MOCVD deposition systems can process a number of substrates simultaneously, but all of the substrates are exposed to the same process conditions and receive the same deposition.

Figure 2A:
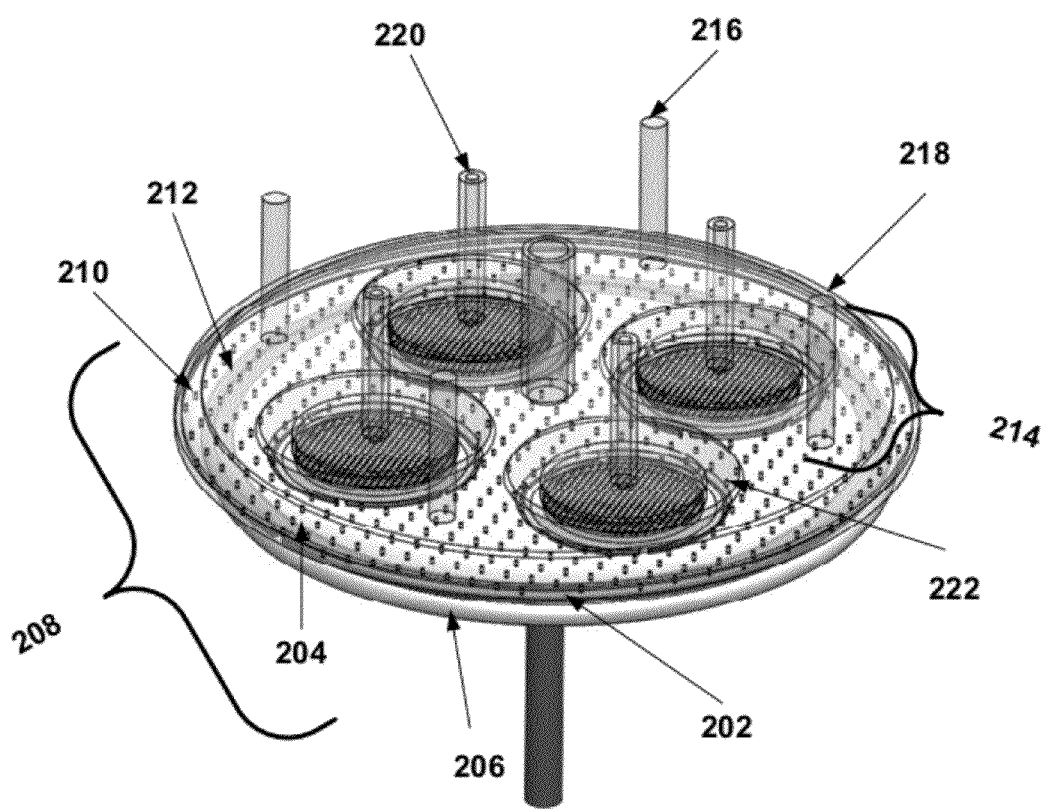
FIGS. 2A and 2B are schematic diagrams of a system according to some embodiments of the present invention.
Figure 2B:
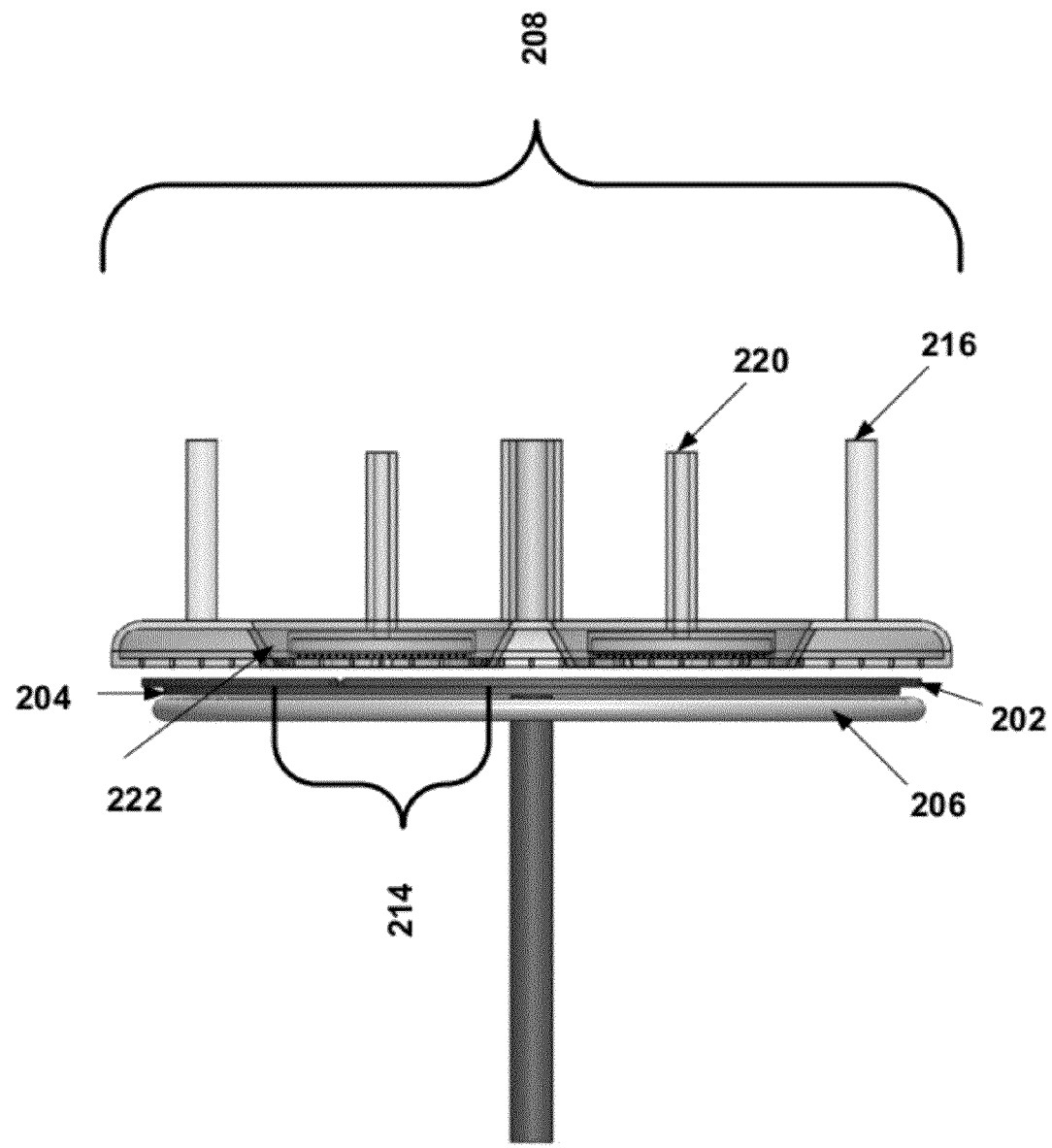

FIGS. 2A and 2B are schematic diagrams of a system that forms a portion of a process chamber according to some embodiments of the present invention. The process chamber may be used to implement one of a PVD, ALD, CVD, or MOCVD process. FIGS. 2A and 2B illustrate a system wherein four regions of a substrate may receive separate deposits wherein the processing conditions of the regions are varied in a combinatorial manner as discussed previously. Those skilled in the art will realize that although four separate regions are illustrated, any number of separate regions may be envisioned. The regions are isolated and the processing conditions within one region do not affect the processing in adjacent regions. The view used in FIG. 2A is from above the multi-zone, combinatorial, gas distribution structure and many of the components are illustrated as being partially transparent so that the spatial arrangement of the various components can be appreciated. The view used in FIG. 2B is from side to show the spatial relationship of the components in the vertical direction. The multi-zone, combinatorial, gas distribution structure may be part of a process chamber. The process chamber may be part of a larger MOCVD system that comprises one or more process chambers.

In FIGS. 2A and 2B, a substrate, 202, is held on a susceptor, 204. In FIGS. 2A and 2B, the susceptor is shown as being slightly smaller than the substrate. This is a specific configuration to allow easy substrate handling in an R&D environment. Those skilled in the art will appreciate that in high volume manufacturing, the susceptor is generally larger than the substrate to provide improved heating uniformity. Susceptor, 204, is heated by induction coil, 206. Although induction heating is common in deposition systems and is used in the present example, those skilled in the art will understand that any commonly known heating method such as resistive heating, lamp heating, etc. may be used. In some embodiments of the present invention, the gas distribution structure is compatible with deposition processes such as PVD, ALD, or CVD performed at temperatures between about 200 C and about 800 C. In some embodiments of the present invention, the gas distribution structure is compatible with MOCVD processes performed at temperatures between about 500 C and about 1500 C. Above the substrate, is a gas distribution structure, 208, that comprises a curtain purge zone, 210, an interstitial purge zone, 212, and a plurality of individual process cells, 214, (in this example—four individual process cells are illustrated). Each process cell is independent of the others and an interstitial purge serves to prevent cross-contamination between adjacent independent process cells. Each of the process cells may have different characteristics. Characteristics that may be varied include the number and pattern of the gas distribution channels, the size of the gas distribution channels, thickness of the showerhead, the distance to the substrate, etc. In the case of a PVD process, characteristics that may be varied include magnet configuration and orientation, etc. These characteristics may be varied in a combinatorial manner to optimize the independent process cell hardware with respect to the deposited material. Purge gas delivery conduits for the curtain purge zone, 210, are illustrated by cylinders, 216. Purge gas delivery conduits for the interstitial purge zone, 212, are illustrated by cylinders, 218. Reactant gas delivery conduits for the individual process cells are illustrated by cylinders, 220. Reactant gas delivery conduits, 220, also serve as the axis of rotation of the individual process cells, 214. That is, each process cell, 214, may be rotated about its central axis defined by its reactant gas delivery conduit, 220. This feature allows a rotation variable to be included in the parameters that may be combinatorially varied during the development of the thin film or deposition process. Each process cell, 214, is surrounded by an exhaust manifold, 222, that exhausts reaction by-products and unreacted precursors from the region below the process cell and will be discussed in more detail below. There is a large, general exhaust manifold (not shown) that exhausts reaction by-products and unreacted precursors from the entire process chamber.

Figure 3:
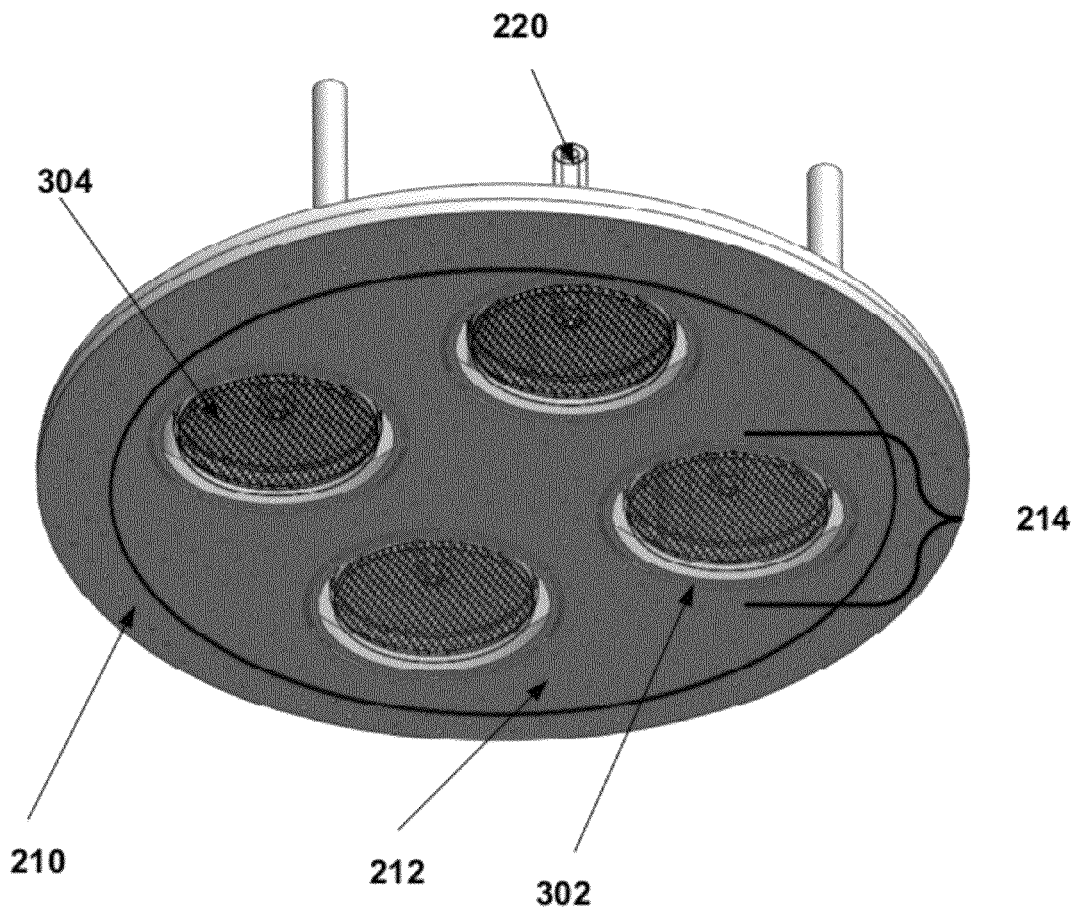
FIG. 3 is a schematic diagram of a system according to some embodiments of the present invention.

FIG. 3 is a schematic of a system according to some embodiments of the present invention. The view used in FIG. 3 is from below the gas distribution structure, 208, and many of the components are illustrated as being partially transparent so that the spatial arrangement of the various components can be appreciated. A ring purge, 302, is illustrated surrounding each process cell, 214. In FIG. 3, the gas distribution manifold for each individual process cell is illustrated as a showerhead configuration, 304, with circular holes. Those skilled in the art will understand that any commonly known gas distribution orifice shape such as holes or slots may be used as part of showerhead, 304. Typically, showerhead, 304, comprises multiple, independent gas channels to keep the various precursor and purge gases separate until they enter the reaction zone above the substrate. Showerhead, 304, is usually constructed of stainless steel with water cooling or a high temperature material such as quartz or a ceramic. In FIG. 3, the curtain purge zone, 210, is illustrated as a showerhead configuration with circular holes. Those skilled in the art will understand that any commonly known gas distribution orifice shape such as holes or slots may be used as part of curtain purge zone showerhead, 210. Alternatively, the curtain purge zone, 210, may comprise other gas distribution manifold types such as a ring purge wherein the ring purge manifold may use holes or slots to distribute the purge gas. In FIG. 3, the interstitial purge zone, 212, is illustrated as a showerhead configuration with circular holes. Those skilled in the art will understand that any commonly known gas distribution orifice shape such as holes or slots may be used as part of interstitial purge zone showerhead, 212.

Figure 4:
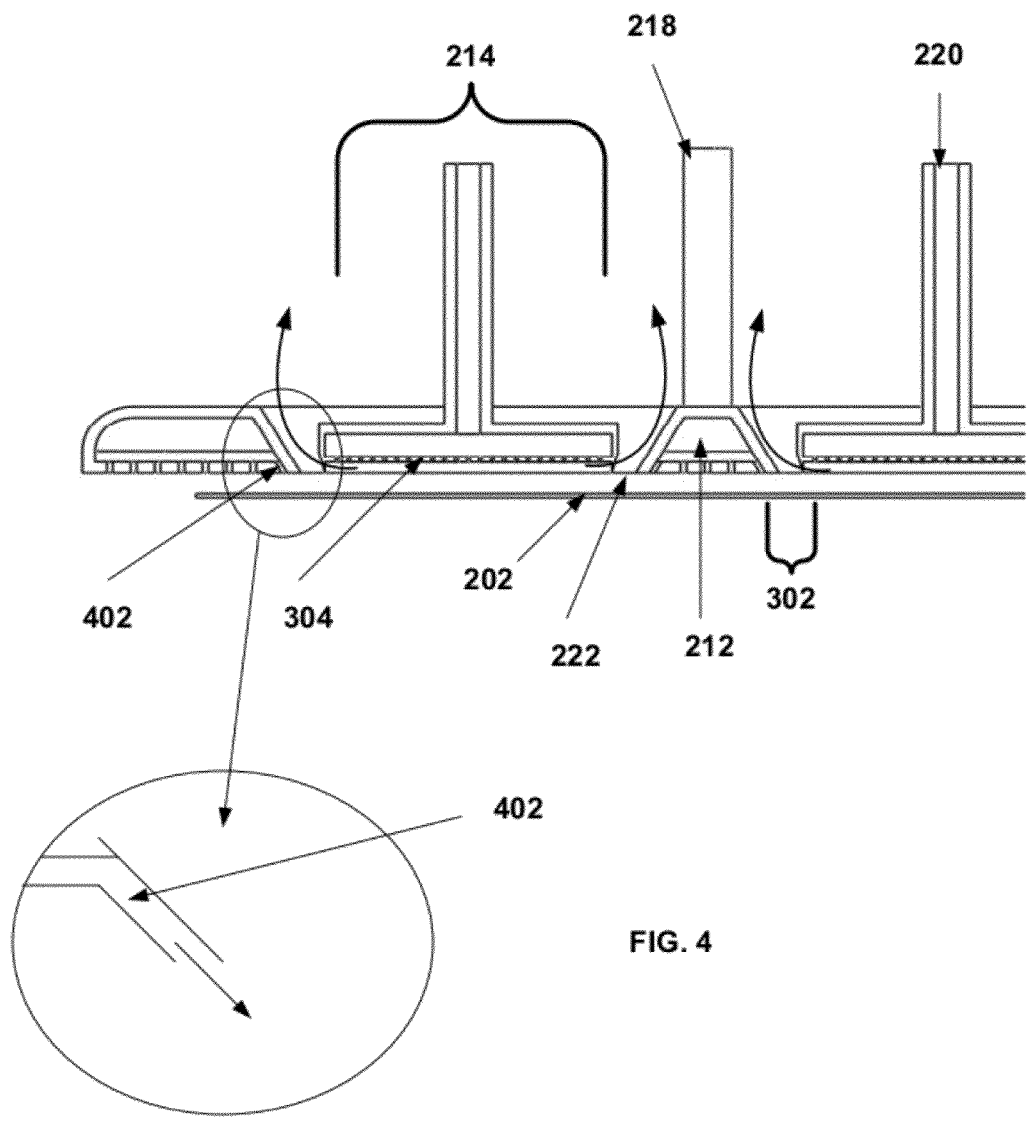
FIG. 4 is a schematic diagram of a system according to some embodiments of the present invention.

FIG. 4 is a schematic diagram of a system according to some embodiments of the present invention. FIG. 4 illustrates the gas flow paths during the deposition process. The reactant gases are conveyed to the process cell showerhead, 304, through conduit 220. The reactant gases will react on the surface of substrate, 202, to form a thin film of material. The energy to drive the deposition reaction may be supplied by thermal energy or may be supplied by plasma energy. Reaction by-products and unreacted gases are exhausted through the exhaust manifold, 222, that surrounds each process cell. The reaction by-products and unreacted gases that are exhausted through the exhaust manifolds, 222, flow over the top of the gas distribution structure and are exhausted by the large, general exhaust manifold (not shown) that exhausts reaction by-products and unreacted precursors from the entire process chamber. The ring purge and interstitial purge zones combine to prevent the reactants from depositing thin film material in the portions of the substrate between the regions under the process cells. In FIG. 4, ring purge, 302, is shown as being an integral part of the interstitial purge delivery manifold and is illustrated as gas channel, 402. A small section has been enlarged to illustrate the configuration of the ring purge channel. However, ring purge, 302, may be constructed as an independent gas channel.

In the case of circular substrates and process cells with a circular shape, the process cells can range in size from about 50 mm (~2 inches) in diameter to about 125 mm (~5 inches) in diameter. If the substrate is about 300 mm (~12 inches) in diameter and the independent process cells are about 125 mm (~5 inches) in diameter, four independent process cells could be configured over the substrate allowing four independent experiments to be conducted on a single substrate. Currently, the largest semiconductor substrate in high volume production has a diameter of about 300 mm (~12 inches). However, in the future, substrates with diameters as large as about 450 mm (~18 inches) are envisioned. The gas distribution structure of the present invention can be increased in scale to accommodate the larger substrate sizes.

In the case of process cells with a circular shape, each process cell showerhead, 304, and associated conduit 220, can be independently rotated so as to incorporate the rotation parameter into the deposition being performed in each region. This feature is unique to this gas distribution structure and has not been available in other showerhead designs used for the HPC development of thin film materials. This feature is especially important in the case of MOCVD deposition processes.

Figure 5:
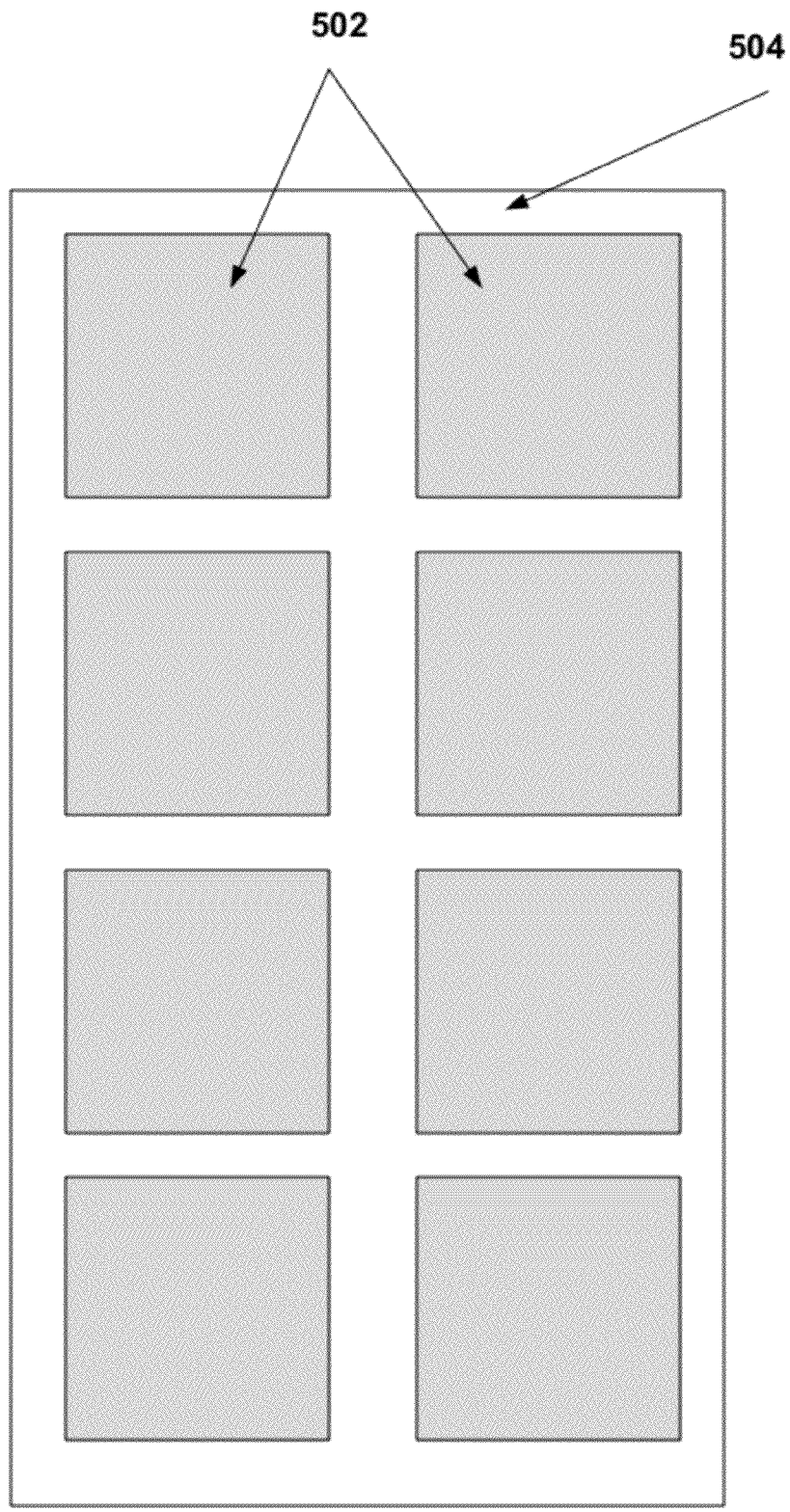
FIG. 5 is a schematic diagram of a system according to some embodiments of the present invention.

If rotation is not an important process parameter, then the process cells can be any number of shapes to adequately and efficiently cover the substrate. Examples of possible shapes other than circular include a triangular shape, a square shape, a rectangular shape, a hexagonal shape, or an octagonal shape. These shapes would be compatible with very large substrates such as those used for solar panels, flat panel displays, etc. The shape and size of the process cells can be selected to maximize the use of the substrate area for the efficient application of HPC development techniques. FIG. 5 illustrates how multiple process cells, 502, with a square shape could be adapted for HPC processing on a large rectangular substrate, 504.

In one example of the present invention, a process chamber comprising a susceptor, an induction heater, a gas distribution structure and a gas exhaust system is used for the development of MOCVD thin films using HPC techniques. Susceptor, 204, is constructed of graphite and is heated using induction coil, 206. The temperature range can vary from about 500 C to about 1500 C. Substrate, 202, with a diameter of about 300 mm is held on susceptor, 204. A gas distribution structure, 208, is situated above the substrate and has an overall diameter of about 400 mm. The distance from the lower surface of the gas distribution structure and the substrate is typically about 25 mm. Gas distribution structure, 208, comprises a curtain purge zone, 210, located around the periphery of the gas distribution structure. The curtain purge zone extends inward from the outer edge of the gas distribution structure by about 50 mm. Purge gases are conveyed to the curtain purge zone by conduits, 216, and utilizes a showerhead configuration to introduce the purge gases into the process chamber. Gas distribution structure, 208, further comprises an interstitial purge zone, 212, located within the interior region of the gas distribution structure. Purge gases are conveyed to the interstitial purge zone by conduits, 218, and utilizes a showerhead configuration to introduce the purge gases into the process chamber. Gas distribution structure, 208, further comprises four process cells, 214, evenly spaced within, and penetrating the interstitial purge zone. The overall diameter of each of the process cells is about 125 mm. The characteristics of each process cell may be varied in a combinatorial manner as discussed earlier. Each process cell assembly may be independently rotated about a central axis of the individual process cell. Each process cell comprises a showerhead, 304, a ring purge, 302, and an individual exhaust manifold, 222 surrounding the showerhead. The ring purge, 302, is located at the outer diameter of the individual exhaust manifold. The showerhead, 304, is about 100 mm in diameter. Reactant gases are conveyed to the showerhead by conduits, 220. Typically, the showerhead comprises separate channels for the various reactant gases and they are kept separate until they react at the substrate surface. Typically, the curtain purge, interstitial purge, and showerhead gas delivery systems are constructed using water cooled stainless steel.

In one example, a multi-zone, combinatorial, gas distribution structure may be configured wherein each process cell comprises different characteristics such as the number and pattern of the gas distribution channels, the size of the gas distribution channels, thickness of the showerhead, the distance to the substrate, etc. In the case of a PVD process, characteristics that may be varied include magnet configuration and orientation, etc. These characteristics may be varied in a combinatorial manner to optimize the process cell hardware with respect to the deposited material. The gas distribution structure may be configured such that each process cell performs the same process sequence using the same process parameters. An MOCVD thin film deposition process sequence will be used as an example. However, those skilled in the art will appreciate that the teachings of this example may be applied to any deposition technique such as PVD, ALD, or CVD. In this configuration, a thin film of material is deposited by MOCVD on the region of the substrate that is located under each process cell. The regions will be isolated from one another as discussed previously. Properties of the thin film and showerhead performance may be evaluated, characterized, and compared against a set of selection criteria. Examples of selection criteria comprise film composition, film uniformity, film deposition rate, film electrical properties, film density, film stress, film contamination content, particle contamination, material deposition on the showerhead surfaces, clogging of the channels in the showerhead, etc. In this configuration, any differences in the film properties will be attributable to the differences in the characteristics of the various process cells.

In another example, a multi-zone, combinatorial, gas distribution structure may be configured wherein each process cell comprises the same characteristics such as the number and pattern of the gas distribution channels, the size of the gas distribution channels, thickness of the showerhead, the distance to the substrate, etc. In the case of a PVD process, characteristics that may be held constant include magnet configuration and orientation, etc. The gas distribution structure may be configured such that each showerhead performs a process sequence using different process parameters. Examples of process parameters that may be varied include pressure, precursor flow rates, purge gas flow rates, precursor flow times, purge gas flow times, precursor gas composition, precursor gas concentration, showerhead rotation, etc. These process parameters may be varied in a combinatorial manner to optimize the process cell process parameters with respect to the deposited material. An MOCVD thin film deposition process sequence will be used as an example. However, those skilled in the art will appreciate that the teachings of this example may be applied to any deposition technique such as PVD, ALD, or CVD. In this configuration, a thin film of material is deposited by MOCVD on the region of the substrate that is located under each showerhead. The regions will be isolated from one another as discussed previously. Properties of the thin film and showerhead performance may be evaluated, characterized, and compared against a set of selection criteria. Examples of selection criteria comprise film composition, film uniformity, film deposition rate, film electrical properties, film density, film stress, film contamination content, particle contamination, material deposition on the showerhead surfaces, clogging of the channels in the showerhead, etc. In this configuration, any differences in the film properties will be attributable to the differences in the process parameters performed in the various process cells.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A process chamber for processing individual regions on a substrate in a combinatorial manner, the process chamber comprising:
    an induction coil;
    a susceptor disposed on the induction coil,
        wherein a substrate is held on the susceptor and the susceptor is smaller relative to a size of the substrate,
            wherein the substrate is divided into a plurality of individual regions; and
    a gas distribution structure disposed over the substrate, the gas distribution structure comprising
        a curtain purge zone,
        an interstitial purge zone, and
        a plurality of process cells,
    wherein each process cell of the plurality of process cells is independent relative to each other and corresponds to a different individual region of the plurality of individual regions of the substrate,
    wherein the each process cell is spaced within the interstitial purge zone and comprises a showerhead disposed over the interstitial purge zone,
    wherein a first set of cylindrical purge gas delivery conduits convey purge gas to the interstitial purge zone for preventing reactants from depositing thin film material in portions of the substrate outside of an area comprising the plurality of process cells,
    wherein a second set of cylindrical purge gas delivery conduits deliver purge gas to the curtain purge zone, the curtain purge zone comprising a ring purge at a periphery of the each process cell,
    wherein the each process cell further comprises an exhaust manifold situated between an outer edge of the showerhead and the ring purge.

2. The process chamber of claim 1, wherein the each process cell has one of a circular shape, a triangular shape, a square shape, a rectangular shape, a hexagonal shape, or an octagonal shape.

3. The process chamber of claim 1, wherein the showerhead disposed over the interstitial purge zone of the each process cell can rotate independently.

4. The process chamber of claim 1, wherein the gas distribution structure is used in one of a physical vapor deposition (PVD), atomic layer deposition (ALD), chemical vapor deposition (CVD), or metal organic chemical vapor deposition (MOCVD) process.

5. The process chamber of claim 1, wherein the susceptor comprises graphite.

6. The process chamber of claim 1, wherein each showerhead disposed over the each process cell comprises stainless steel.

7. The process chamber of claim 1, wherein each showerhead disposed over the each process cell comprises one of quartz or a ceramic.

8. The process chamber of claim 1, wherein each showerhead is connected to a reactant gas source for supplying reactant gas to a respective process cell.

9. The process chamber of claim 8, wherein the reactant gas source is one of a thermal energy source or a plasma energy source.

10. The process chamber of claim 1, wherein the substrate is divided into four individual regions; and
    wherein the gas distribution structure comprises four process cells.

11. The process chamber of claim 10, wherein each of the four process cells has a circular shape; and
    wherein each of the four process cells has a diameter of about 50 mm to about 125 mm.

12. The process chamber of claim 1, wherein the substrate has a rectangular shape; and
    wherein each of the plurality of process cells has a square shape configured for combinatorial processing.

13. The process chamber of claim 1, wherein the showerhead disposed over the interstitial purge zone of the each process cell has a diameter of 100 mm.

14. The process chamber of claim 1, wherein the exhaust manifold of the each process cell is an individual exhaust manifold for exhausting reaction by-products and unreacted precursors from the each process cell; and
    wherein the process chamber further comprises a general exhaust manifold disposed over the top of the gas distribution structure for exhausting reaction by-products and unreacted precursors from the process chamber.

15. The process chamber of claim 1, wherein the gas distribution structure is configured to enable a first showerhead in a first process cell to perform a process sequence using different process parameters than that of an adjacent process cell.

16. The process chamber of claim 15, wherein the process parameters include at least one of pressure, precursor flow rates, purge gas flow rates, precursor flow times, purge gas flow times, precursor gas composition, precursor gas concentration, or showerhead rotation.

17. The process chamber of claim 1, wherein the each process cell has different characteristics than an adjacent process cell.

18. The process chamber of claim 17, wherein the different characteristics include one of a showerhead thickness, a distance to the substrate, magnet configuration, or magnet orientation.

19. The process chamber of claim 1, wherein the gas distribution structure has an overall diameter of about 400 mm.

20. The process chamber of claim 19, wherein a distance from a lower surface of the gas distribution structure and the substrate is about 25 mm.

* * * * *